United States Patent
Vincent et al.

(10) Patent No.: US 10,538,197 B2
(45) Date of Patent: Jan. 21, 2020

(54) ELECTRONIC CONTROL MODULE FOR A VEHICLE LIGHTING AND/OR SIGNALING DEVICE AND METHOD OF REPLACING A MODULE OF THIS KIND

(71) Applicant: VALEO VISION, Bobigny (FR)

(72) Inventors: Steve Vincent, Angers (FR); Mehdi Madelaine, Angers (FR)

(73) Assignee: VALEO VISION, Bobigny (FR)

( * ) Notice: Subject to any disclaimer, the term of this patent is extended or adjusted under 35 U.S.C. 154(b) by 259 days.

(21) Appl. No.: 15/496,608

(22) Filed: Apr. 25, 2017

(65) Prior Publication Data

US 2017/0305334 A1    Oct. 26, 2017

(30) Foreign Application Priority Data

Apr. 25, 2016  (FR) ...................... 16 53637

(51) Int. Cl.
| | | |
|---|---|---|
| *B60Q 1/34* | (2006.01) | |
| *B60Q 1/00* | (2006.01) | |
| *H05K 5/00* | (2006.01) | |
| *F21S 43/00* | (2018.01) | |

(52) U.S. Cl.
CPC ............ *B60Q 1/34* (2013.01); *B60Q 1/0064* (2013.01); *B60Q 1/0094* (2013.01); *F21S 43/00* (2018.01); *H05K 5/0073* (2013.01); *B60Q 2400/30* (2013.01)

(58) Field of Classification Search
CPC ...... B60Q 1/34; B60Q 1/0064; B60Q 1/0094; B60Q 2400/30; B60Q 1/007; F21S 43/00; F21S 41/192; F21S 45/47; F21S 41/147; H05K 5/0073; H05K 2201/10106; H05K 5/0247; F21V 17/06; F21V 17/005
See application file for complete search history.

(56) References Cited

U.S. PATENT DOCUMENTS

| | | | |
|---|---|---|---|
| 2007/0086175 A1* | 4/2007 | Davis ................... | H05K 7/1435 361/802 |
| 2010/0124034 A1* | 5/2010 | Shouyama ............... | H05K 1/02 361/756 |
| 2011/0205712 A1 | 8/2011 | Colongo et al. | |
| 2015/0176795 A1 | 6/2015 | Kikuchi et al. | |
| 2015/0211721 A1* | 7/2015 | Mornet ................. | F21S 41/192 362/547 |
| 2016/0334072 A1* | 11/2016 | Meyrenaud ............. | F21S 41/24 |
| 2016/0363285 A1* | 12/2016 | Mornet ............... | F21V 19/0035 |

FOREIGN PATENT DOCUMENTS

| | | |
|---|---|---|
| EP | 2 362 720 A1 | 8/2011 |
| EP | 2 479 062 A1 | 7/2012 |

OTHER PUBLICATIONS

French Preliminary Search Report dated Jan. 9, 2017 in French Application 16 53637 filed on Apr. 25, 2016 (with English Translation of Categories of Cited Documents).

* cited by examiner

*Primary Examiner* — Abhishek M Rathod

(74) *Attorney, Agent, or Firm* — Oblon, McClelland, Maier & Neustadt, L.L.P.

(57) ABSTRACT

An electronic control module of a light source includes at least one circuit card supporting electronic components and configured to be received by a first of its edges in a housing. The control module has in the vicinity of the first edge a connecting portion including at least one rib perpendicular or substantially perpendicular to the plane defined by the circuit card.

19 Claims, 3 Drawing Sheets

ELECTRONIC CONTROL MODULE FOR A VEHICLE LIGHTING AND/OR SIGNALING DEVICE AND METHOD OF REPLACING A MODULE OF THIS KIND

The invention concerns motor vehicle lighting and/or signaling devices and more particularly concerns electronic control modules equipping such lighting and/or signaling devices and the means employed to replace a worn out or defective module.

In particular for controlling turning light sources in a motor vehicle lighting and/or signaling device on and off, there is installed in the casing of these devices an electronic control module for said sources, notably including an electronic control circuit card otherwise known as a "driver". Once this circuit card has been installed in the casing of the device, the electronic components that the card supports are connected to the light sources, notably light-emitting diodes. The electronic control module then enables collection of information on external conditions by means of state sensors or instructions coming from the driver and generation of instructions controlling the light sources. For example, the electronic control module can automatically turn on the light sources in the context of the daytime running light (DLR) protocol, which makes it obligatory for some vehicles to include lighting and/or signaling components turned on automatically during daytime, notably to make the vehicle more visible when moving. It has been specified that the control module enables control of turning the light sources on and off, but it will be understood that it can further control the power supply voltages of the sources and the luminous intensity produced by the associated device.

The electronic control module is mounted on the inside of the casing of the lighting and/or signaling device and must be fixed by means of a reversible connection in order to be able to demount the module from the casing if it is defective and it is necessary to replace it. Thus there are known electronic control modules disposed in a housing formed in the casing and retained in position in that housing by screws. Clearly to replace a defective module it is in this case necessary to unscrew the fixing screw or screws, withdraw the defective module from its housing in order to extract it from the casing, and then to place a new module in that same housing and finally to screw in the fixing screws one by one. This necessitates complicated and time-consuming screwing and unscrewing operations within the confined space of the casing.

Moreover, if the initial screwing operation to install the module in the casing at the outset is risk-free because the casing is at that time empty of other components, clearly the various components presents in the casing, and notably the light sources, are not removed if a defective module must be exchanged, with the result that unscrewing and screwing in are effected with the sources in position and the latter may be damaged by dropped screws, a dropped screwdriver, etc.

An object of the invention is to provide an electronic control module that is easy to produce and easy to mount in a lighting and/or signaling device casing and the replacement of which in the event of a malfunction is fast and risk-free. Thus the aim is notably to facilitate the extraction of the electronic control modules form the casing into which they are integrated.

To this end, there is provided a electronic control module of a light source including at least one circuit card supporting electronic components that is configured so that one of its edges is received in a housing, characterized in that the control module includes in the vicinity of said first edge a connection portion including at least one rib perpendicular or substantially perpendicular to the plane defined by the circuit card. By substantially perpendicular is meant a difference of 1 or 2° between the median plane of the rib and the plane defined by the circuit card.

Therefore, if it is wished to remove the control module, it is no longer necessary to work inside the casing. It suffices to remove the support from the casing. That extraction is simple and fast.

According to various features of the invention, separately or in combination:
- the electronic control module is adapted to be accommodated in a nominal position in a support fastened to a wall of a casing of a lighting device;
- the connection portion is profiled; by "profiled" is meant that a shape extends in a given direction and having a constant cross section along that direction;
- the rib extends the first edge;
- the connection portion is L-shaped;
- the rib extends at a constant distance from the first edge;
- the profiled rib extends the entire length of the first edge;
- a cover for protecting the electronic components supported by the circuit card is disposed against the card and the rib of the connecting portion is formed on the cover;
- the cover may have a curved central portion covering the electronic components of the circuit card and a substantially plane contour pressed against the circuit card, the rib of the connecting portion being produced on said contour so as to form a clearance between the central portion and the connecting portion.

The invention also concerns a lighting device including at least one light source accommodated in a casing and at least one electronic control module according to the invention. The term electronic control module is notably intended to cover a device for conversion of an electrical power supply from an electrical power supply network of the vehicle into an electrical power supply suitable for the implementation of a required lighting function, and possibly to provide said electrical power supply suitable for a light source for the implementation of said required lighting function.

In particular, the device may have one or more of the following features:
- the casing defines a cavity receiving one or more light sources and associated optical systems, the casing being closed by an outer lens;
- the electronic control module is received in a housing fastened to a wall of the casing;
- the housing is in one piece with the wall of the casing;
- the wall of the casing includes a pre-cut zone in line with the housing;
- the pre-cut zone includes at least one thinner zone of the wall of the casing; by thinner is meant that the thickness of the wall in this zone is less than the thickness of the rest of the wall, thus creating a localized area of weakness enabling easy cutting by an operative;
- the housing is formed in a support including a cap, formed by a portion of the wall of the casing, and a slideway extending the cap toward the interior of the casing, said slideway having a shape complementary to that of the connecting portion of the circuit card;
- the slideway includes a groove configured to receive the rib projecting perpendicularly from the connecting portion of the circuit card; in particular, the slideway may consist of two facing walls extending the cap perpendicularly toward the interior of the casing with at least one groove on the internal face of one of the walls;

the groove extends in a direction parallel to the plane defined by the cap;

a locking screw is provided in the support for immobilizing the module inside the support;

the casing includes an internal wall including a cut-out for retaining a second edge of the electronic control module opposite the first edge;

the cut-out extends parallel or substantially parallel to the groove in the slideway.

The invention further concerns a method of replacing an electronic control module arranged inside a lighting device and electrically connected to one or more light sources, the electronic control module being accommodated in a nominal position in a support fastened to a wall of a casing of the device with at least one rib on the module extending in a groove of the support substantially parallel to said wall. According to the invention, a step is provided of electrical disconnection of the light source or sources from the electronic control module to be replaced, a step of partial cutting of the wall of the casing around the housing from outside the casing, a step of extraction of the support relative to the device, the support taking the module with it by virtue of cooperation of the rib on the module and the groove in the support, a step of positioning a new electronic control module equipped with a support including a closure cap matching the opening, an electrical connection step and a step of fixing the closure cap of the new electronic control module to the wall of the casing from outside the casing.

The wall cut during the extraction step may notably be pre-cut, for example by virtue of a reduced thickness in certain zones of the wall.

The cap may notably be fixed by means of clamping screws cooperating with clamping posts arranged on the wall of the casing around the partially pre-cut zone of the wall.

The positioning step involving insertion of the new electronic control module in the opening formed by cutting the wall part may be carried out until the second edge of the electronic circuit card abuts against the cut-out formed in the internal wall of the casing facing the opening.

The above features of the invention and others will become more clearly apparent on reading the following detailed description of nonlimiting examples with reference to the appended drawings, in which.

Figure 1:
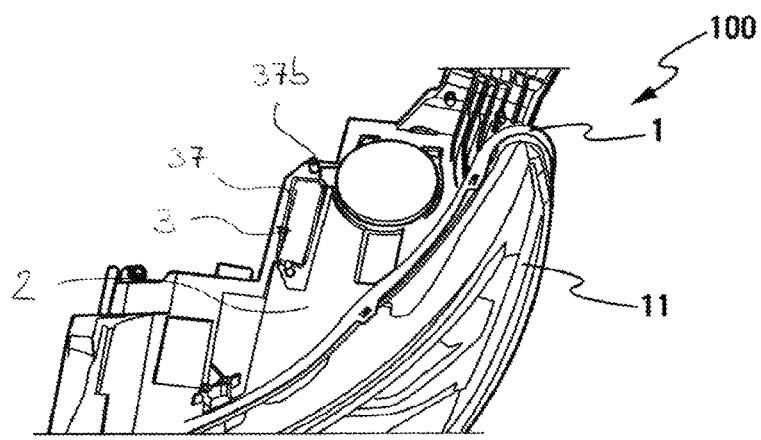
FIG. 1 shows a lighting device, notably a motor vehicle lighting and/or signaling device, seen from above.

The device 100 in FIG. 1 is a vehicle lighting and signaling device including a casing 1 closed by an outer lens 11 to define an area to receive one or more lighting modules configured to implement a lighting and/or signaling function. A lighting module includes at least one light source 12 and an electronic control module 13, the module 13 being connected to the light source 12 by connections 14 such as electrical cables.

Figure 5:
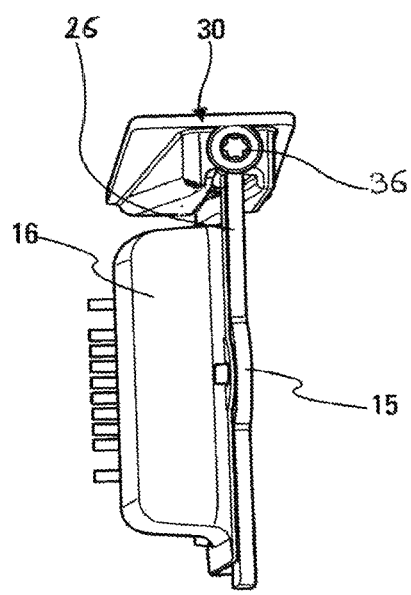
FIGS. 5 and 6 show an assembly formed of the control module from FIG. 3 and the support from FIG. 4 in an assembled configuration, in perspective (FIG. 5) and in section (FIG. 6)

As it was possible to specify hereinbefore, the electronic control module 13 determines the value of the power supply voltage of the light source 12 as a function of data that it receives. The electronic control module 13 includes at least one circuit guide 15 supporting electronic components that is substantially plane and from which is deployed a bundle of electrical cables 14 (visible in FIGS. 3 and 5). In the situation shown, the circuit card 15 is covered by a cover 16 notably serving as means for protection of the electronic components.

The circuit card 15 includes electronic components, not shown, situated on a first face 17 of the circuit card to which the cover 16 is rigidly fixed. The cover 16 includes a curved central portion 16a covering the electronic components on the circuit card and delimited by a peripheral lateral wall 16b and has a substantially plane contour 18 pressed against the circuit card and extending said peripheral lateral wall.

Indexing means 19 may be provided for positioning the cover 16 on the first face 17 of the circuit card 15 by cooperation of pins 19a carried by the circuit card 15 with orifices formed in fingers 19b carried by the cover. The fixing of the cover to the card is then effected by any means, for example by gluing.

The electronic control module 13 has on a first edge 20 a connecting portion 21 configured to cooperate with a support 30 described hereinafter, an opposite second edge 22 and a guide portion 23 configured to cooperate with a cut-out formed in an internal wall of the casing described hereinafter.

The connecting portion 21 includes at least one rectilinear rib 24 perpendicular or substantially perpendicular to the plane defined by the circuit card 15 supporting the electronic components. In the example shown, the rib 24 extends the entire width of the control module 13, i.e. the entire dimension of the first edge 20, from one corner to another of the circuit card 15.

Figure 3:
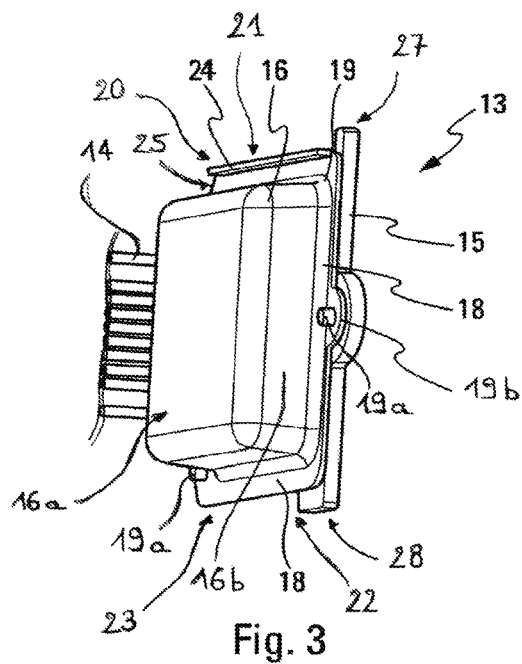
FIG. 3 is a perspective view of an electronic control module according to one embodiment of the invention.
Figure 6:
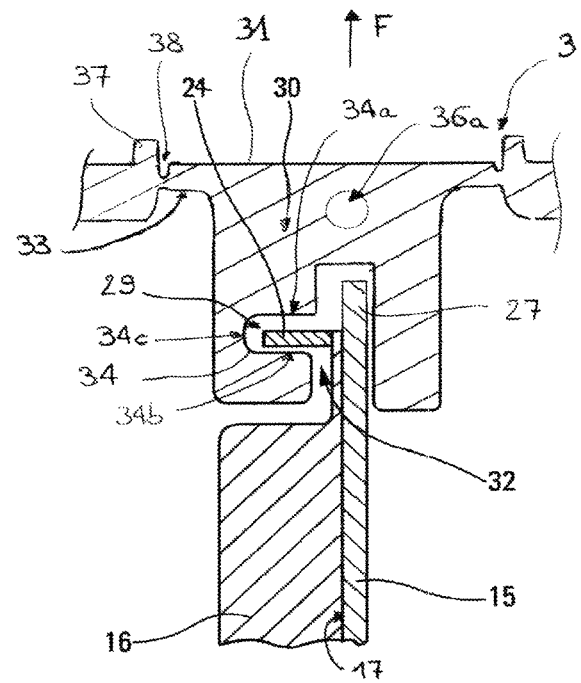

Note that in the example shown in FIGS. 3 and 6 the connecting portion is formed by a rectilinear rib 24 extending the contour 18 of the cover 16 substantially perpendicularly. The cover can notably be made of galvanized steel (for example galvanized steel of the type DX 54+Z 100). The chosen material makes it possible to produce the rib by bending one edge of the cover 16, being sufficiently rigid to withstand extraction of the support. In particular, the rectilinear rib 24 can extend an edge of the cover by means of a bend so that in conjunction with the contour 18 of the cover and the rectilinear rib 24 the connecting portion 21 is L-shaped. The effect of this rib is to attach the cover and consequently the entire electronic control module 13 to the support 30. Clearly the rectilinear linear rib could be at a constant distance from the first edge of the electronic control module, the profiled shape of the connecting portion then being different from the L-shape described above and shown by way of example in the figures. Note that in each case the rectilinear rib 24 extends at a distance from the peripheral lateral face 16b of the cover 16, being separated therefrom by a plane clearance portion 25 formed by the contour 18.

As can be seen in FIGS. 3 and 6 in particular, the circuit card 15 supporting the electronic components has a first cut-out 26 perpendicular to the first edge 20 and the second edge 22 of the electronic control module 13 that extends axially beyond the first edge and beyond the second edge to form projecting elements 27, 28 of the control module, namely a first projecting element 27 in the vicinity of the first edge 20 and the rectilinear rib 24 and a second projecting element 28 in the vicinity of the opposite second edge 22.

Figure 4:
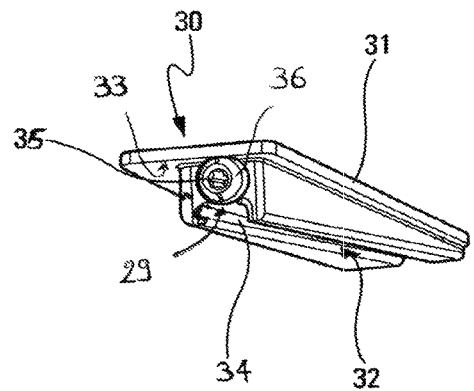
FIG. 4 is a perspective view of a support according to one embodiment, the control module from FIG. 3 being configured to be received in the support from FIG. 4.

As has already been stated, the electronic control module is configured to cooperate with a housing 29 in a support 30 shown separately in FIG. 4. Said support 30 includes a plane surface of rectangular shape with rounded corners and forming a cap 31 and a slideway 32 formed of two walls perpendicularly extending an internal face 33 of the cap so as to be parallel and to face each other and to define between them the housing 29 that is to receive the electronic control module 13.

The slideway 32 includes a rib 34 on the internal face of one of the two walls and substantially perpendicular to the general direction of the passage defined between the two walls of the slideway. The groove 34 extends substantially the entire length of the support 30 and opens onto at least a first side 35 of said support so that the rectilinear rib 24 of the electronic control module can be inserted in the housing 29 by sliding it in the groove 34 from this first side of the support. In the embodiment shown, the groove opens onto only one side of the support and the bottom of the groove in the support defines an abutment for the insertion of the module 13 into the support in an insertion direction substantially parallel to the lengthwise direction of the groove.

When the module 13 is inserted in the support, the module is retained in position by means of a clamping screw 36 screwed into a bore 36a (visible in FIG. 6) parallel to the direction of insertion of the module in the support, the screwhead then formed an abutment for at least the first projecting element 27 and preventing extraction of the module from the support.

Note that in the position with the module 13 assembled into the support 30, shown in FIG. 6 in particular, the rectilinear rib 24 is disposed in the groove 34 defining the housing 29 at least in part. The groove 34 includes a first wall, here an upper wall 34a, and a second wall, here a lower wall 34b, connected by a bottom wall 34c of the groove. The thickness of the rectilinear rib 24 is such that it faces the first and second walls 34a, 34b.

Thus the module 13 cannot be separated from the support 30 if a force F (visible in FIGS. 6 and 10) is exerted in a direction perpendicular to that of the rib 24 of the module and the groove 34 of the support. During extraction, the rib 24 is pressed against one or the other of the walls 34a, 34b and this contact entrains the rib and the module with the support.

Clearly any type of housing able to receive the rib 24 of the module and to retain it in position may be suitable, provided that application thereto of a force F as described above does not enable separation of the support 30 from the module 13.

According to the invention, the presence of this rectilinear rib in the groove of the support enables simultaneous manipulation of the support and the electronic control module. This is advantageous in particular if it is required to extract a defective module from the casing of a lighting device, as described hereinafter.

Figure 2:
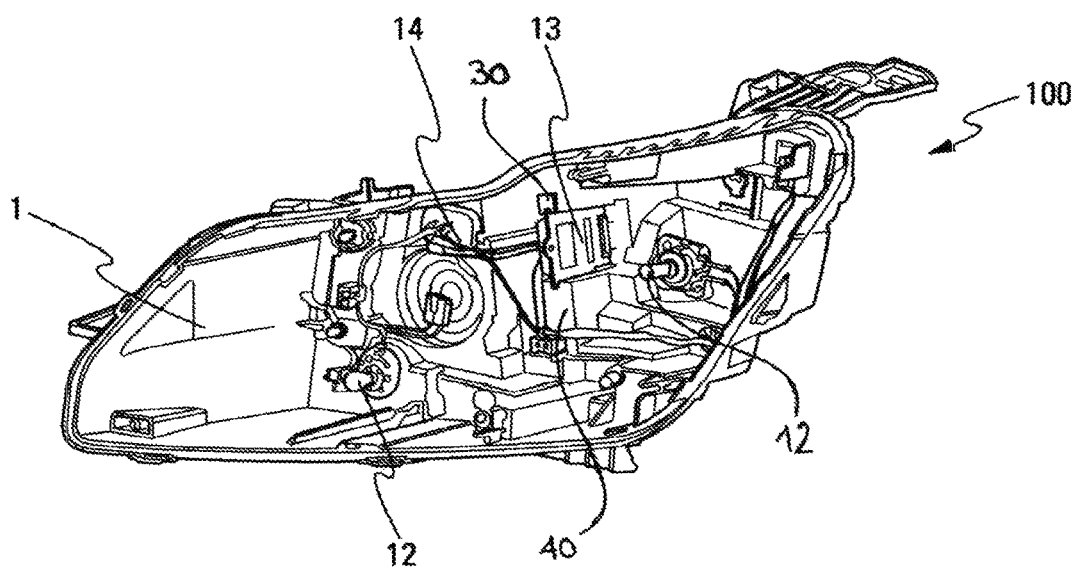
FIG. 2 shows a casing forming part of the device from FIG. 1, seen from the inside and in perspective.
Figure 7:
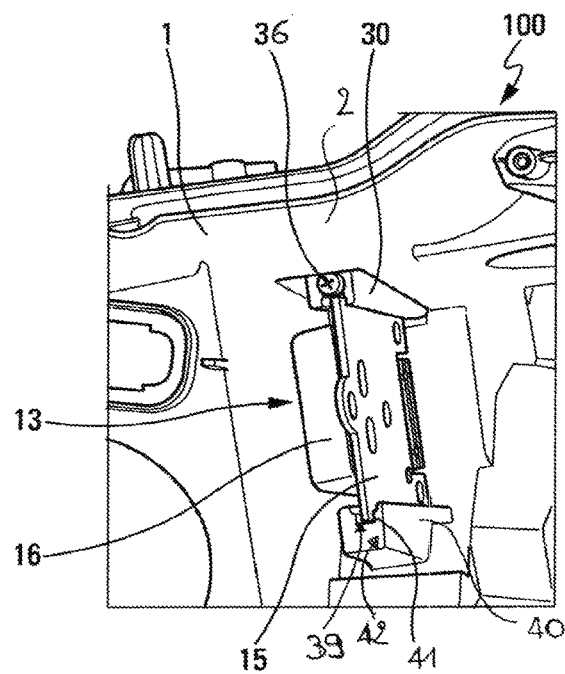
FIGS. 7 and 8 show the assembly from FIGS. 5 and 6 installed in a casing of the lighting device and in an operating position, seen from inside the casing (FIG. 7) and from outside the casing (FIG. 8)

As shown in FIG. 2, and shown more clearly in FIG. 7, the support 30 is originally an integral part of the casing 1, in the sense that the support is in one piece with a wall 2 of the casing. In the situation shown, the wall 2 into which the support 30 is integrated is the upper wall of the casing and the force F that is exerted to extract the support and the associated module from the casing is then essentially vertical, although it will be clear that other orientations could be employed without departing from the scope of the invention provided that the arrangement of the rib of the module and the groove of the support is substantially perpendicular to the direction of said force F.

Referring to FIG. 6 in particular, it is clear that the cap 31 of the support 30 is formed by the wall 2 of the casing 1 and that the slideway 32 projects from this wall 2 toward the interior of the casing. The cap 31 is delimited in the wall 2 by a pre-cut zone 3 distinct from the rest of the wall 2. In particular, this pre-cut zone 3 may be an area of weakness formed by a lesser thickness of the wall in this zone than in the rest of the wall 2.

In the example shown, the wall 2 includes around this pre-cut zone 3 a boss 37 forming a projection on the outside face of the wall 2 of the casing. Inside said boss, the wall has a lesser thickness than in the other areas, thus forming the cap 31. As shown here, the area of weakness may be accentuated by notches 38 formed continuously over the entire perimeter of the cap or on a point by point basis so as in this way to facilitate the pre-cutting of the cap 31. Clearly notches could also be produced on the internal face of the wall of the casing.

The peripheral boss 37 is produced on the walls so that the projection on the wall 2 of each of the elements of the control module 13 and the support 30 is located inside said boss. The pre-cut zone is therefore in line with the electronic control module. As described hereinafter, it is therefore certain that if the wall is cut at the level of this peripheral boss the assembly formed by the module and the support can be extracted from the casing via the opening formed by cutting the wall at the level of the peripheral boss.

Figure 8:
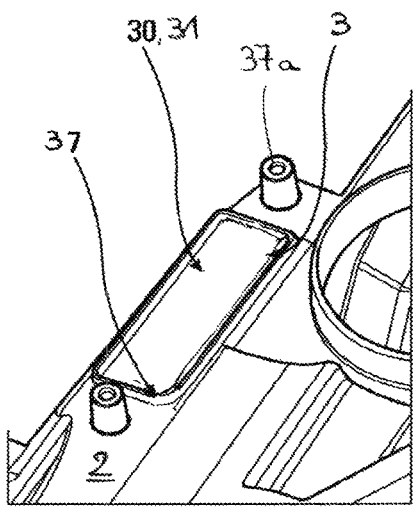

As can be seen in FIG. 1 and FIG. 8, two screw posts 37b are formed on respective opposite sides of the peripheral boss.

In the embodiment shown, the electronic control module 13 is disposed in the casing between the housing 29 formed in the support 30, fastened to one of the walls 2 delimiting the outside perimeter of the casing, and an additional housing 39 formed in an internal wall 40 having a cut-out 41.

The cut-out 41 extends parallel to the groove 34 in the support 30. It opens on at least the first side 42 of the internal wall and is open in the direction of the support 30 with the result that the openings of the cut-out 41 and the slideway 32 face one another in the absence of the module. In other words, the cut-out is defined by two parallel walls and a bottom wall that extends substantially parallel to the groove 34. The cut-out is sized so that the guide portion 23 at the second edge 22 of the control module can be accommodated therein, at least at the level of the second projecting element 28.

If the support 30 is formed in the upper wall 2 of the casing and the internal wall 40 extends vertically below said support, the electronic control module rests against the back wall of the cut-out and the rectilinear rib is in the position shown in FIG. 6, i.e. at a distance from both walls of the groove 34 on the support 30.

FIG. 7 shows the assembly installed in the casing 1 in a nominal position, i.e. an operating position. Instead of placing therein one end of the card 15, an edge of the cover 16 could equally be located in the cut-out 41. Clearly the function of the cut-out 41 here is to facilitate the positioning of the control module 13, as much during initial mounting as when replacing a defective control module, at the same time as enabling the removal of a defective module in the direction away from the cut-out by extraction of the support 30 and with it the module 13. Moreover, it should be noted that the internal wall 40 and the cut-out in which the module is accommodated enable immobilization of the module against rotation and vibrations thereof to be limited.

Here the casing 1 of the lighting and/or signaling device is a plastic casing, injection molded in one step, With a zone for fixing the electronic control module including the support and its groove and the facing internal wall.

Before the first use of the casing, a circuit card supporting electronic components and the associated cover are inserted in the slideway 32 of the support 30, and where applicable in the cut-out 41. The projecting elements of the circuit card enter the housing 29 and the additional housing 39 via the first side 35 of the support and the first side 42 of the internal wall. At the same time, the rectilinear rib 24 is inserted in the groove 34 in the support. The operative pushes in the control module so that it slides inside the slideway 32 and the internal wall 40 until the rectilinear rib comes into contact with the bottom of the groove 34.

In this position, the last possible movement, namely movement in translation in the direction opposite the insertion direction, is prevented by screwing the clamping screw 36 into the bore 36a. The control module 13 is therefore rigidly attached to the support 30, in a nominal position.

The operative can then assemble the rest of the components of the lighting device into the casing, notably the optical components.

A demounting method is described next the objective of which is to extract the control module, a fortiori the control card 15, from the casing 1 to replace a defective control module.

If it is required to change or to repair the control card, the wall 2 of the casing carrying the support 30 is cut at the level of the peripheral boss 37 from outside the casing. Providing a pre-cut zone at the level of this peripheral boss, i.e. an area of weakness and for example a thinner area, enables the operative to cut the appropriate area with a simple tool, for example a simple retractable-blade cutter, with no loss of accuracy or effectiveness.

The operative then pulls on the cut wall portion, corresponding to the cap 31 of the support 30, and entrains with the cap the entirety of the support and the control module, constrained to move with this movement in translation by virtue of the rectilinear rib of the module being trapped in the groove in the support. Before removing the assembly formed by the support and the module completely from the casing via the opening cut in the wall in this way, the operative disconnects the cables 14 from the defective module.

Figure 9:
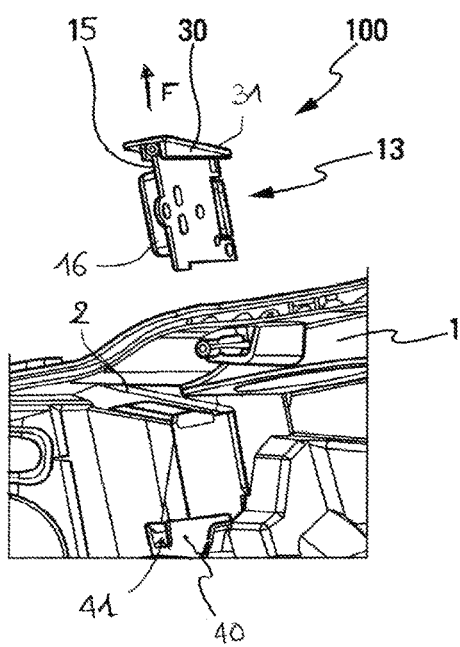
FIG. 9 shows a successive step of a method of replacing a defective electronic control module during which the assembly from FIGS. 5 and 6 is removed from the interior of the casing by cutting a portion of the wall shown in FIG. 8.

When the operative raises the support 30, the rib 24 retaining the module 13 in the support 30 enables the module 13 to be entrained with the support. This results in the arrangement shown in FIG. 9 in which the module and the support have been extracted from the casing.

Here it is clear that it is beneficial to have a rectilinear rib formed on the module and configured to cooperate with the groove in the support, namely the possibility of easy extraction of the module from the casing, from the outside, without it being necessary to perform screwing and unscrewing operations inside the casing. The extraction of the defective module is rapid and simple and does not generate risks of damage to the device. The extraction of the module is all the simpler and faster in that a wall of the casing is pre-cut. The pre-cut zone can for example take the form of lines of weakness intentionally produced at the level of the contours of the casing or discontinuous cuts.

Once the defective module has been withdrawn, the operator places a new control module in the casing by inserting it via the passage previously formed in the wall 2, i.e. via the opening formed inside the peripheral boss. It should be noted that this new control module advantageously features an assembly formed of a circuit card, electronic components and a cover similar to that which was previously extracted from the casing, whereas the support differs from the support previously removed in that the cap is larger. As a result, when the new electronic control module is fitted, the cap 31 comes to rest against the peripheral boss. A seal can be provided between the cap and the peripheral boss to seal the casing. Moreover, the new cap includes bores for fixing screws, not shown here, to pass through, sized to cooperate with the screwing posts 37b in order to immobilize the new electronic control module in position.

Clearly a new electronic control module can be positioned as much by abutment of the cap on the peripheral boss as by abutment of the cap on the screwing posts or by abutment of the second projecting element 28 of the new electronic control module in the cut-out in the internal wall.

Thus the new module has been installed in this way with screwing operations carried out outside the casing, with the result that the risks of dropping screws or damage to the interior of the product by a screwdriver, for example, are avoided. Only one operation of electrical connection is necessary inside the casing, i.e. an operation involving no tools.

As just described, the invention provides a simple way to replace a defective electronic control module without having to risk damaging optical and/or electronic components also present in the casing of the lighting device in which the invention is used.

The invention claimed is:

1. An electronic control module of a light source including at least one circuit card supporting electronic components and configured to be received by a first of its edges in a housing, wherein the control module has in the vicinity of said first edge a connecting portion including at least one rib perpendicular or substantially perpendicular to the plane defined by the circuit card.

2. The electronic control module according to claim 1, wherein the connecting portion is profiled.

3. The electronic control module according to claim 1, wherein the rib extends the first edge.

4. The electronic control module according to claim 3, wherein the connecting portion is L-shaped.

5. The electronic control module according to claim 2, wherein the rib extends at a constant distance from the first edge.

6. The electronic control module according to claim 1, wherein the rib extends all along the first edge.

7. The electronic control module according to claim 1, wherein the module includes a cover for protecting the electronic components supported by the card and in that the rib of the connecting portion is formed on the cover.

8. The electronic control module according to claim 7, wherein the cover has a curved central portion covering the electronic components of the circuit card and a substantially plane contour pressed against the circuit card, the rib of the connecting portion being formed on said contour so as to form a clearance between the central portion and the connecting portion.

9. A lighting device including at least one light source accommodated in a casing and at least one electronic control module according to claim 1 adapted to control at least said light source.

10. The lighting device according to claim 9, wherein the electronic control module is received in a housing formed in a support fastened to a wall of the casing.

11. The lighting device according to claim 10, wherein the support is in one piece with the wall of the casing.

12. The lighting device according to claim 11, wherein the wall of the casing includes a pre-cut zone in line with the electronic control module.

13. The lighting device according to claim 12, wherein the pre-cut zone includes at least one thinner zone of the wall of the casing.

14. The lighting device according to claim 13, wherein the housing is formed in a support including a cap formed by a portion of the wall of the casing and a slideway extending the cap toward the interior of the casing, said slideway having a shape complementary to that of the connecting portion of the electronic control module.

15. The lighting device according to claim 14, wherein the slideway includes a groove configured to receive the rib projecting perpendicularly from the connecting portion of the electronic control module.

16. The lighting device according to claim 15, wherein the groove extends in a direction parallel to the plane defined by the cap.

17. The lighting device according to claim 16, including a screw for clamping the electronic control module into the support.

18. The lighting device according to claim 17, wherein the casing includes an internal wall including a cut-out for retaining the electronic control module at the level of a second edge opposite the first edge.

19. The lighting device according to claim 18, wherein the cut-out is parallel or substantially parallel to the groove in the slideway.

* * * * *